(12) United States Patent
Juvonen et al.

(10) Patent No.: US 9,502,959 B2
(45) Date of Patent: Nov. 22, 2016

(54) DETECTION OF ISLANDING STATE IN ELECTRICITY NETWORK

(71) Applicant: ABB Technology AG, Zurich (CH)

(72) Inventors: Linda Juvonen, Lohja (FI); Mikko Routimo, Espoo (FI)

(73) Assignee: ABB Schweiz AG, Baden (CH)

( * ) Notice: Subject to any disclaimer, the term of this patent is extended or adjusted under 35 U.S.C. 154(b) by 28 days.

(21) Appl. No.: 14/695,855

(22) Filed: Apr. 24, 2015

(65) Prior Publication Data

US 2015/0311781 A1    Oct. 29, 2015

(30) Foreign Application Priority Data

Apr. 25, 2014   (EP) .................................... 14165985

(51) Int. Cl.
  *H02J 3/38*    (2006.01)
  *H02M 7/539*   (2006.01)
  *H02M 1/36*    (2007.01)
  (Continued)

(52) U.S. Cl.
  CPC ............... *H02M 1/36* (2013.01); *G01R 21/00* (2013.01); *G01R 23/02* (2013.01); *G01R 31/40* (2013.01); *H02J 3/38* (2013.01); *H02J 3/381* (2013.01); *H02M 5/02* (2013.01); *H02M 5/451* (2013.01); *H02M 7/539* (2013.01); *H02J 2003/388* (2013.01)

(58) Field of Classification Search
  CPC .... H02J 3/38; H02J 2003/388; H02M 7/539; H02M 5/451
  See application file for complete search history.

(56) References Cited

U.S. PATENT DOCUMENTS

| 6,172,889 | B1 | 1/2001 | Eguchi et al. |
| 7,015,597 | B2 * | 3/2006 | Colby ............ H02J 3/1835 307/31 |

(Continued)

FOREIGN PATENT DOCUMENTS

| CN | 103645404 A | 3/2014 |
| EP | 0 810 713 A2 | 12/1997 |
| WO | WO 2011/097147 A2 | 8/2011 |

OTHER PUBLICATIONS

Z. Liu et al., "The Research of Islanding Detection about the Photovoltaic Grid-Connected Generation System", International Journal of Computer and Electrical Engineering, (Jun. 2013), vol. 5, No. 3, pp. 305-308.

(Continued)

*Primary Examiner* — Timothy J Dole
*Assistant Examiner* — Ishrat Jamali
(74) *Attorney, Agent, or Firm* — Taft Stettinius & Hollister LLP

(57) ABSTRACT

An exemplary method for detecting a three-phase islanding state in a three-phase electricity network includes supplying power to a three-phase electricity network via a power supply assembly, controlling an output frequency of the power supply assembly with a frequency reference signal adapted to deviate the output frequency of the power supply assembly from a grid frequency representing a frequency of a common electricity network whose portion of the three-phase electricity network is in normal operating conditions. The method also includes detecting a three-phase islanding state in the electricity network if the output frequency of the power supply assembly is outside an allowable value range. During a normal operating state of the electricity network, the frequency reference signal depends on an active output current of the power supply assembly.

15 Claims, 1 Drawing Sheet

(51) Int. Cl.
  *H02M 5/451*  (2006.01)
  *G01R 21/00*  (2006.01)
  *G01R 23/02*  (2006.01)
  *G01R 31/40*  (2014.01)
  *H02M 5/02*   (2006.01)

(56) References Cited

U.S. PATENT DOCUMENTS

2006/0082936 A1* 4/2006 Ye ............................ H02J 3/38
                                                       361/38
2011/0187200 A1  8/2011 Yin et al.
2012/0063179 A1  3/2012 Gong et al.
2012/0287683 A1* 11/2012 Routimo ................... H02J 3/12
                                                       363/40
2013/0077367 A1* 3/2013 Zhu ........................... H02J 3/16
                                                       363/97

OTHER PUBLICATIONS

Office Action (Patent Examination Report No. 1) issued on Oct. 1, 2015, by the Australian Patent Office in corresponding Australian Patent Application No. 2015202071. (5 pages).
European Search Report issued on Aug. 25, 2014, by the European Patent Office for Application No. EP 14165985.4.
Seul-Ki Kim et al, "Frequency-Shift Acceleration Control for Anti-Islanding of a Distributed-Generation Inverter", IEEE Transactions Industrial Electronics, vol. 57, No. 2, Feb. 2010.

* cited by examiner

DETECTION OF ISLANDING STATE IN ELECTRICITY NETWORK

RELATED APPLICATION(S)

This application claims priority under 35 U.S.C. §119 to European application 14165985.4 filed on Apr. 25, 2014, the content of which is hereby incorporated by reference in its entirety.

FIELD

The present disclosure relates to detection of a three-phase islanding state in a three-phase electricity network.

BACKGROUND INFORMATION

Distributed energy resource units, like solar cells or wind turbines, connected to a common electricity network can provide in this electricity network islands, e.g., parts of the common electricity network, which can be provided with power generation of their own. A three-phase islanding state is a loss-of-mains situation in which all three phases of an electricity network incorporating power generation lose connection with the rest of the common electricity network. It is important to detect a three-phase islanding state because it causes a safety hazard within the electricity network separated from the common electricity network.

In a known method a power supply assembly supplying power in a three-phase electricity network is controlled by a frequency reference signal adapted to deviate the output frequency of the power supply assembly from a grid frequency, wherein a three-phase islanding state is detected if an output frequency of the power supply assembly is outside an allowable value range. The grid frequency represents a frequency of a common electricity network whose part the three-phase electricity network is in normal operating conditions. The frequency reference signal is formed by multiplying a difference between the output frequency of the power supply assembly and the grid frequency with a disturbance constant.

The known methods for three-phase islanding detection increase harmonic distortion in the electricity network and/or detect a three-phase islanding state slowly depending on a magnitude of the disturbance constant.

SUMMARY

An exemplary method for detecting a three-phase islanding state in a three-phase electricity network is disclosed, the method comprising: supplying power to a three-phase electricity network by a power supply assembly having an output frequency; controlling the output frequency of the power supply assembly with a frequency reference signal adapted to deviate the output frequency of the power supply assembly from a grid frequency representing a frequency of a common electricity network whose portion of the three-phase electricity network is in normal operating conditions; monitoring a magnitude of a frequency quantity obtainable from the output frequency of the power supply assembly; and detecting a three-phase islanding state in the electricity network if the magnitude of the frequency quantity is outside an allowable value range by forming a stimulus signal obtainable by multiplying a difference between the output frequency of the power supply assembly and the grid frequency by a stimulus coefficient, wherein forming of the frequency reference signal includes addition of the output frequency of the power supply assembly and the stimulus signal, and during a normal operating state of the electricity network the stimulus coefficient is a function of an active output current of the power supply assembly.

An exemplary system for detecting a three-phase islanding state in a three-phase electricity network is disclosed, the system comprising: a power supply assembly for supplying power with an output frequency into a three-phase electricity network; and control means configured to: form a frequency reference signal; control the output frequency of the power supply assembly with the frequency reference signal, the frequency reference signal being adapted to deviate the output frequency of the power supply assembly from a grid frequency representing a frequency of a common electricity network whose part the three-phase electricity network is in normal operating conditions; monitor a magnitude of a frequency quantity obtainable from the output frequency of the power supply assembly; and detect a three-phase islanding state in the electricity network if the magnitude of the frequency quantity is outside an allowable value range, wherein the control means is configured to form a stimulus signal obtainable by multiplying a difference between the output frequency of the power supply assembly and the grid frequency by a stimulus coefficient, wherein forming the frequency reference signal includes addition of the output frequency of the power supply assembly and the stimulus signal, and during a normal operating state of the electricity network the stimulus coefficient is a function of an active output current of the power supply assembly.

BRIEF DESCRIPTION OF THE DRAWINGS

In the following, the disclosure will be described in greater detail by exemplary embodiments with reference to the attached drawings, in which.

DETAILED DESCRIPTION

Exemplary embodiments of the present disclosure provide a method and a system for implementing the method to alleviate the above disadvantages.

Exemplary embodiments described herein are based on the idea of disturbing a frequency reference signal of a power supply assembly during a normal operating state of an electricity network with a stimulus signal which is a function of an active output current of the power supply assembly.

An exemplary method and system of the present disclosure provide that a three-phase islanding state can be detected quickly and without unduly increasing harmonic distortion in the electricity network.

Figure 1:
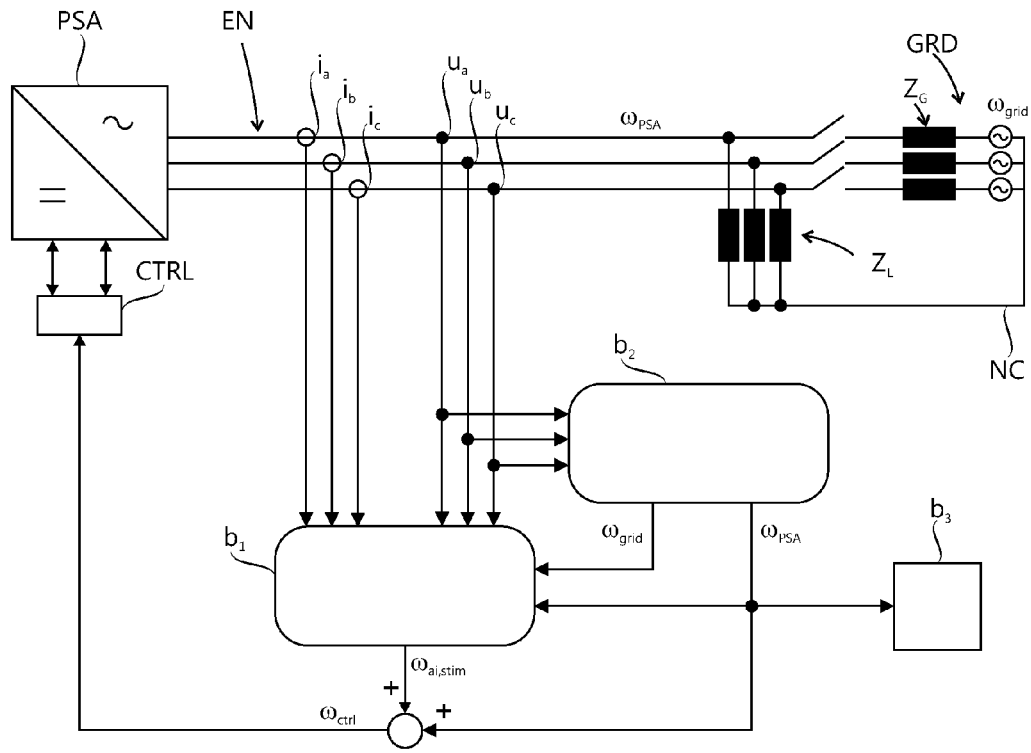
FIG. 1 shows a block diagram illustrating a method for detecting a three-phase islanding state according to an exemplary embodiment of present disclosure.

FIG. 1 shows a block diagram illustrating a method for detecting a three-phase islanding state according to an exemplary embodiment of present disclosure. FIG. 1 also shows a three-phase electricity network EN and a common electricity network GRD whose portion (e.g., part) of the three-phase electricity network EN is in normal operating conditions, e.g., when an islanding state is not present in the electricity network EN. The electricity network EN is in a three-phase islanding state which is illustrated by an open three-phase switch between the electricity network EN and the common electricity network GRD. Herein a common electricity network is an electricity network larger than the three-phase electricity network whose islanding state the method is detecting.

The electricity network EN includes (e.g., comprises) load ZL connected to the phases of the electricity network EN. Line impedance of the common electricity network GRD is denoted with ZG. In the three-phase islanding state of FIG. 1 the electricity network EN has lost connection with the common electricity network GRD and therefore impedance seen from an output of the power supply assembly PSA has changed.

The electricity network EN of FIG. 1 is provided with a neutral conductor NC. However, according to exemplary embodiments of the present disclosure can also be utilized in electricity networks which do not have a neutral conductor.

An exemplary method for detecting a three-phase islanding state in the electricity network EN includes supplying power to the electricity network EN by a power supply assembly PSA having an output frequency ωPSA, controlling the output frequency ωPSA of the power supply assembly PSA with a frequency reference signal ωctrl adapted to deviate the output frequency ωPSA of the power supply assembly PSA from a grid frequency ωgrid representing a frequency of the common electricity network GRD whose part the three-phase electricity network EN is in normal operating conditions, monitoring a magnitude of a frequency quantity obtainable from the output frequency ωPSA of the power supply assembly, and detecting a three-phase islanding state in block b3 if the magnitude of the frequency quantity is outside an allowable value range. The allowable value range can be set by a grid code. For example, in an electricity network whose nominal frequency is 50 Hz, an allowable value range can be from 47 Hz to 52 Hz.

When an islanding state is not present, the output frequency ωPSA of the power supply assembly PSA follows an actual frequency of the common electricity network GRD regardless of the frequency reference signal ωctrl. This result from the fact that the common electricity network GRD is a very rigid network compared to the electricity network EN. The frequency reference signal ωctrl is only capable of deviating the output frequency ωPSA of the power supply assembly PSA from the grid frequency ωgrid during a three-phase islanding state.

According to an exemplary embodiment of the present disclosure the frequency quantity is an angular frequency of the output of the power supply assembly. In alternative embodiment the frequency quantity is a frequency of the output of the power supply assembly. One skilled in the art understands that although reference signs used for frequency terms in FIGS. 1 and 2 refer to angular frequency values it is naturally possible to carry out the calculations with temporal frequency values.

Forming of the frequency reference signal ωctrl includes the addition of the output frequency ωPSA of the power supply assembly and a stimulus signal ωai,stim, according to the equation:

$$\omega ctrl = \omega PSA + \omega ai,stim$$

The stimulus signal ωai,stim is formed in block b1 whose input information includes phase currents ia, ib and ic of the electricity network EN, phase voltages ua, ub and uc of the electricity network EN, the output frequency ωPSA of the power supply assembly, and the grid frequency ωgrid. The phase currents ia, ib and ic as well as the phase voltages ua, ub and uc can include measured values or estimates provided by control the power supply assembly PSA.

Block b2 determines the output frequency ωPSA of the power supply assembly based on the phase voltages ua, ub and uc using a suitable known method. In an alternative embodiment, the output frequency of the power supply assembly is obtained using a phase-locked loop. The grid frequency ωgrid is a long-term average of the output frequency ωPSA of the power supply assembly stored in the block b2. The long-term average of the output frequency ωPSA is practically equal to an average frequency of the common electricity network GRD since in normal operating conditions the three-phase electricity network EN is a part of the common electricity network GRD. In an alternative embodiment, the grid frequency is a frequency determined for synchronization of the power supply assembly PSA with the three-phase electricity network EN. In another alternative embodiment, the grid frequency is a value based on measurements carried out in the common electricity network GRD.

Figure 2:
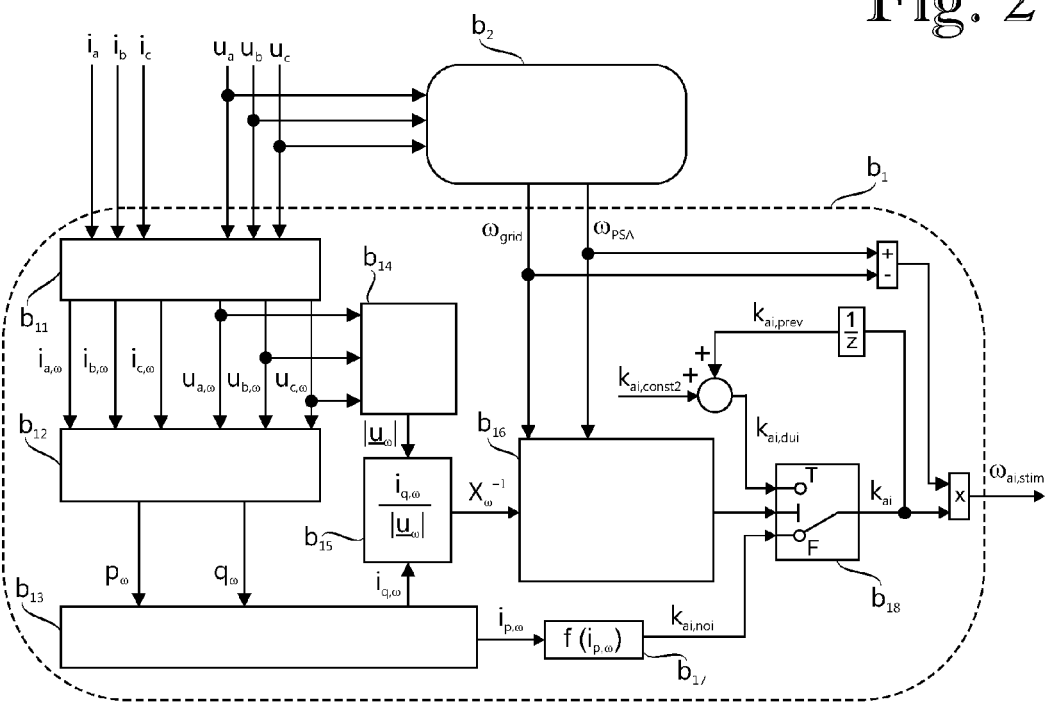
FIG. 2 shows more detailed information on the block diagram of FIG. 1 according to an exemplary embodiment of present disclosure.

FIG. 2 shows more detailed information on the block b1 diagram of FIG. 1 according to an exemplary embodiment of present disclosure. The stimulus signal ωai,stim is formed in block b1 by multiplying a difference between the output frequency ωPSA of the power supply assembly and the grid frequency ωgrid by a stimulus coefficient kai, according to equation:

$$\omega ai,stim = kai(\omega PSA - \omega grid)$$

The electricity network EN can have a normal operating state and a potential islanding state. The electricity network EN is transferred from a normal operating state into a potential islanding state if predetermined first conditions can be fulfilled. Fulfillment of the first conditions is checked in block b16. The electricity network EN is transferred back from the potential islanding state into the normal operating state if predetermined first conditions can be no longer fulfilled.

The predetermined first conditions for transferring the electricity network into the potential islanding state include condition $$\left| \frac{d}{dt} X_\omega^{-1} \right| > 0,$$

wherein Xω is a reactance seen from an output of the power supply assembly PSA. Change in the output frequency of the power supply assembly PSA affects said reactance Xω. Monitoring a time derivative of a multiplicative inverse of the reactance Xω enables using a small value for the stimulus coefficient kai in a normal operating state of the electricity network EN. The predetermined first conditions for transferring the electricity network into the potential islanding state also comprise condition $$\left| \frac{d}{dt}(\omega_{PSA} - \omega_{grid}) \right| > 0,$$

wherein ωPSA is the output frequency of the power supply assembly PSA, and ωgrid is the grid frequency.

In the exemplary embodiment of FIG. 2, the predetermined first conditions are fulfilled if at least one of the above inequalities is true. If at least one of the above inequalities is true, an output of block b16 is TRUE and a potential islanding state is present. In a potential islanding state block b18 assigns value kai,dui for the stimulus coefficient kai. If none of the above inequalities is true, an output of block b16 is FALSE and the electricity network EN is allowed to remain in a normal operating state. In a normal operating state block b18 assigns value kai,noi for the stimulus coefficient kai.

Each of the above inequalities includes comparing an absolute value with zero. One skilled in the art understands that in some exemplary embodiments it is useful to compare an absolute value with a limit value greater than zero. In such exemplary embodiments, above inequalities can be modified into below form $$\left|\frac{d}{dt}X_\omega^{-1}\right| > \alpha_1$$

$$\left|\frac{d}{dt}(\omega_{PSA} - \omega_{grid})\right| > \alpha_2,$$

wherein α1 is a first limit value and α2 is a second limit value. The predetermined first conditions for transferring the electricity network into the potential islanding state can include one or both of these modified inequalities. Magnitudes of the first limit value α1 and the second limit value α2 can have embodiment-specific values.

The stimulus coefficient kai,noi is a function of an active output current of the power supply assembly PSA. In other words, the stimulus coefficient kai,noi depends on an active output current of the power supply assembly PSA. The stimulus coefficient kai,noi is calculated in block b17. The active output current of the power supply assembly is the active output current that the power supply assembly PSA supplies to the electricity network EN. If the power supply assembly PSA takes active current from the electricity network EN the active output current can have a negative sign.

Herein a stimulus coefficient is considered to be a function of an active output current of the power supply assembly if the stimulus coefficient is a function of an active power of the power supply assembly. After all, a voltage is usually more or less constant and therefore a change in an active power correlates substantially with a change in an active output current of the power supply assembly. Thus, a stimulus coefficient is considered not to be a function of an active output current of the power supply assembly only if the stimulus coefficient is independent of the active output current of the power supply assembly.

In block b17 the stimulus coefficient kai,noi is calculated as a function of a grid frequency active current ip,ω of the power supply assembly PSA as explained below. In exemplary embodiments where there is only little disturbance in an electricity network it is possible to use an unfiltered value of an active output current of the power supply assembly.

In an exemplary embodiment of the present disclosure, the stimulus coefficient kai,noi is obtainable by subtracting an absolute value of the grid frequency active current ip,ω of the power supply assembly from a first constant kai,const1, according to below equation.

$$k_{ai,noi} = k_{ai,const1} - |i_{p,\omega}|$$

When a per-unit system is used the first constant kai,const1 can have a value 3, for example. In the per-unit system a grid frequency active current ip,ω of the power supply assembly PSA can have a value 1 pu (per-unit) when the power supply assembly PSA supplies active current into the electricity network EN with a nominal value thereof.

The stimulus coefficient kai can have a higher absolute value during a potential islanding state than during a normal operating state. In an embodiment the stimulus coefficient kai,dui is obtainable by addition of a second constant kai,const2 and a previous value of the stimulus coefficient kai,prev, according to below equation.

$$k_{ai,dui} = k_{ai,const2} + k_{ai,prev}$$

A previous value kai,prev of the stimulus coefficient is a value previously calculated for the stimulus coefficient kai. In the block diagram of FIG. 2 forming of the previous value, e.g., delaying a signal representing the stimulus coefficient kai, is denoted with 1/z. When a per-unit system is used the second constant kai,const2 can have a value 0.5, for example. In an exemplary embodiment described herein, a new value for the stimulus coefficient kai is determined at 2 ms intervals. In another exemplary embodiment, a maximum value kai,max is set for the stimulus coefficient such that during a potential islanding state the stimulus coefficient kai is not allowed to exceed the maximum value kai,max of the stimulus coefficient.

Block b15 supplies block b16 with a multiplicative inverse of the reactance Xω. This multiplicative inverse value is formed in blocks b11, b14 and b15 based on the phase currents ia, ib and ic, and the phase voltages ua, ub and uc. In block b11, components with grid frequency can be separated from the phase currents and phase voltages. Resulting grid frequency phase currents can be denoted with ia,ω, ib,ω and ic,ω, and resulting grid frequency phase voltages can be denoted with ua,ω, ub,ω and uc,ω. In block b14, a magnitude of a grid frequency voltage is calculated based on the grid frequency phase voltages ua,ω, ub,ω and uc,ω. In block b15 a multiplicative inverse of the reactance Xω is calculated according to equation $$X_\omega^{-1} = \frac{i_{q,\omega}}{|u_\omega|},$$

where iq,ω is a grid frequency reactive current, and |uω| is a magnitude of a grid frequency voltage.

In block b12 a grid frequency active power pω and a grid frequency reactive power qω can be calculated based on the grid frequency phase currents ia,ω, ib,ω and ic,ω and the grid frequency phase voltages ua,ω, ub,ω and uc,ω. In block b13 a grid frequency reactive current iq,ω and a grid frequency active current ip,ω can be calculated based on the grid frequency active power pω and grid frequency reactive power qω.

In an exemplary embodiment of the present disclosure, grid frequency components such as the grid frequency phase currents ia,ω, ib,ω and ic,ω and the grid frequency phase voltages ua,ω, ub,ω and uc,ω can be components whose frequency corresponds to the grid frequency ωgrid defined above. In an exemplary embodiment, grid frequency components can be components whose frequency corresponds to a frequency of the three-phase electricity network.

The grid frequency components can be formed by band-pass filtering original components. For example, the grid frequency phase currents ia,ω, ib,ω and ic,ω and the grid frequency phase voltages ua,ω, ub,ω and uc,ω can be formed by band-pass filtering the phase currents ia, ib and is of the electricity network EN and the phase voltages ua, ub and uc of the electricity network EN, respectively.

Grid codes and standards relating to electricity networks normally do not allow a three-phase islanding state. Further, grid codes set a time limit in which a three-phase islanding state should be cleared. Such a time limit is different in different countries and can be in a range from 0.3 to 1.0 seconds. Therefore, a method according to an embodiment of the present disclosure includes stopping the supply of power to the electricity network by the power supply assembly as a response to the detection of a three-phase islanding state. Alternatively, it is possible to change an operating state of the electricity network as a response to a detected three-phase islanding state. In some exemplary embodiments of the present disclosure, an alarm is provided to operating personnel of the electricity network so that the operating personnel can stop the power supply assembly from supplying power to the electricity network or to change an operating state of the electricity network in order to take the three-phase islanding state into account.

Power supply into the electricity network by the power supply assembly can be stopped by opening a switch between the power supply assembly and the electricity network. Such a switch is not depicted in the Figures. In another exemplary embodiment of the present disclosure, stopping the supply of power to the electricity network by the power supply assembly includes shutting down the power supply assembly.

According to exemplary embodiments of the present disclosure the blocks $b_1$, $b_2$, and $b_3$ can include one or more of any known general purpose processor or integrated circuit such as a central processing unit (CPU), microprocessor, field programmable gate array (FPGA), Application Specific Integrated Circuit (ASIC), or other suitable programmable processing or computing device or circuit as desired. The general processor(s) can be configured to include and perform features of the exemplary embodiments of the present disclosure such as, a method for detecting a three-phase islanding state in a three-phase electricity network, and thereby function as a special and unique processor. The features can be performed through program code encoded or recorded on the processor(s), or stored in a non-volatile memory device, such as Read-Only Memory (ROM), erasable programmable read-only memory (EPROM), or other suitable memory device or circuit as desired. In another exemplary embodiment, the program code can be provided in a computer program product having a non-transitory computer readable medium, such as Magnetic Storage Media (e.g. hard disks, floppy discs, or magnetic tape), optical media (e.g., any type of compact disc (CD), or any type of digital video disc (DVD), or other compatible non-volatile memory device as desired) and downloaded to the processor(s) for execution as desired, when the non-transitory computer readable medium is placed in communicable contact with the processor(s).

Thus, it will be appreciated by those skilled in the art that the present invention can be embodied in other specific forms without departing from the spirit or essential characteristics thereof. The presently disclosed embodiments can be therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for detecting a three-phase islanding state in a three-phase electricity network, the method comprising:
supplying power to a three-phase electricity network by a power supply assembly having an output frequency;
controlling the output frequency of the power supply assembly with a frequency reference signal adapted to deviate the output frequency of the power supply assembly from a grid frequency representing a frequency of a common electricity network whose portion of the three-phase electricity network is in normal operating conditions;
monitoring a magnitude of a frequency quantity obtainable from the output frequency of the power supply assembly; and
detecting a three-phase islanding state in the electricity network if the magnitude of the frequency quantity is outside an allowable value range by forming a stimulus signal obtainable by multiplying a difference between the output frequency of the power supply assembly and the grid frequency by a stimulus coefficient, wherein forming of the frequency reference signal includes addition of the output frequency of the power supply assembly and the stimulus signal, and during a normal operating state of the electricity network the stimulus coefficient is a function of an active output current of the power supply assembly.

2. A method according to claim 1, wherein during the normal operating state the stimulus coefficient is obtainable by subtracting an absolute value of the active output current of the power supply assembly from a first constant.

3. The method according to claim 1, comprising:
stopping a supply of power to the electricity network by the power supply assembly as a response to a detection of the three-phase islanding state.

4. The method according to claim 1, wherein the method includes transferring the electricity network from the normal operating state into a potential islanding state if predetermined first conditions are fulfilled, and the stimulus coefficient has a higher absolute value during the potential islanding state than during the normal operating state.

5. The method according to claim 4, wherein the predetermined first conditions for transferring the electricity network into the potential islanding state includes a condition $$\left|\frac{d}{dt}(\omega_{PSA}-\omega_{grid})\right| > \alpha_2,$$

wherein ωPSA is the output frequency of the power supply assembly, ωgrid is the grid frequency, and α2 is a second limit value.

6. The method according to claim 4, comprising:
transferring the electricity network from the potential islanding state into the normal operating state if predetermined first conditions are no longer fulfilled.

7. The method according to claim 4, wherein during the potential islanding state forming of the stimulus coefficient includes addition of a second constant and a previous value of the stimulus coefficient.

8. The method according to claim 7, wherein the stimulus coefficient has a maximum value such that during the potential islanding state the stimulus coefficient is not allowed to exceed the maximum value of the stimulus coefficient.

9. The method according to claim 4, wherein during the normal operating state the stimulus coefficient is obtainable by subtracting an absolute value of the active output current of the power supply assembly from a first constant.

10. The method according to claim 4, wherein the predetermined first conditions for transferring the electricity network into the potential islanding state includes a condition $$\left|\frac{d}{dt}X_\omega^{-1}\right| > \alpha_1,$$

where $X\omega$ is a reactance seen from an output of the power supply assembly, and $\alpha 1$ is a first limit value.

11. The method according to claim 10, wherein the predetermined first conditions for transferring the electricity network into the potential islanding state include $$\left|\frac{d}{dt}(\omega_{PSA} - \omega_{grid})\right| > \alpha_2,$$

where $\omega PSA$ is an output frequency of the power supply assembly, $\omega$grid is a grid frequency, and $\alpha 2$ is a second limit value.

12. The method according to claim 10, comprising:
transferring the electricity network from the potential islanding state into the normal operating state if predetermined first conditions are no longer fulfilled.

13. The method according to claim 10, wherein during the potential islanding state forming of the stimulus coefficient includes addition of a second constant and a previous value of the stimulus coefficient.

14. The method according to claim 13, wherein the stimulus coefficient has a maximum value such that during the potential islanding state the stimulus coefficient is not allowed to exceed the maximum value of the stimulus coefficient.

15. A system for detecting a three-phase islanding state in a three-phase electricity network, the system comprising:
a power supply assembly for supplying power with an output frequency into a three-phase electricity network; and
control means configured to:
form a frequency reference signal;
control the output frequency of the power supply assembly with the frequency reference signal, the frequency reference signal being adapted to deviate the output frequency of the power supply assembly from a grid frequency representing a frequency of a common electricity network whose part the three-phase electricity network is in normal operating conditions;
monitor a magnitude of a frequency quantity obtainable from the output frequency of the power supply assembly; and
detect a three-phase islanding state in the electricity network if the magnitude of the frequency quantity is outside an allowable value range,
wherein the control means is configured to form a stimulus signal obtainable by multiplying a difference between the output frequency of the power supply assembly and the grid frequency by a stimulus coefficient,
wherein forming the frequency reference signal includes addition of the output frequency of the power supply assembly and the stimulus signal, and during a normal operating state of the electricity network the stimulus coefficient is a function of an active output current of the power supply assembly.

\* \* \* \* \*